United States Patent
Lee et al.

(10) Patent No.: US 7,338,890 B2
(45) Date of Patent: *Mar. 4, 2008

(54) LOW FABRICATION COST, HIGH PERFORMANCE, HIGH RELIABILITY CHIP SCALE PACKAGE

(75) Inventors: Jin Yuan Lee, Hsin-chu (TW);
Ming-Ta Lei, Hsin chu (TW);
Ching-Cheng Huang, Hsinchu (TW);
Chuen-Jye Lin, Ta-Tu Hsiang Taichung (TW)

(73) Assignee: Megica Corporation, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/136,650

(22) Filed: May 24, 2005

(65) Prior Publication Data
US 2005/0215043 A1    Sep. 29, 2005

Related U.S. Application Data (60) Continuation of application No. 10/638,454, filed on Aug. 11, 2003, now Pat. No. 6,917,119, which is a division of application No. 09/953,525, filed on Sep. 17, 2001, now Pat. No. 6,642,136.

(51) Int. Cl.
*H01L 21/44* (2006.01)

(52) U.S. Cl. ............ 438/613; 438/614; 257/737; 257/780

(58) Field of Classification Search ........ 257/737, 257/738, 780; 438/613, 614
See application file for complete search history.

(56) References Cited

U.S. PATENT DOCUMENTS

| | | | |
|---|---|---|---|
| 5,656,858 A * | 8/1997 | Kondo et al. ........... 257/737 |
| 5,879,964 A | 3/1999 | Paik et al. ............. 438/113 |
| 6,103,552 A * | 8/2000 | Lin ....................... 438/113 |
| 6,107,180 A | 8/2000 | Munroe et al. .......... 438/613 |
| 6,181,569 B1 | 1/2001 | Chakrovorty ........... 361/761 |
| 6,479,900 B1 * | 11/2002 | Shinogi et al. .......... 257/758 |
| 6,707,159 B1 * | 3/2004 | Kumamoto et al. ..... 257/778 |
| 6,998,711 B1 * | 2/2006 | Farrar ................... 257/737 |
| 2001/0026021 A1 * | 10/2001 | Honda .................... 257/778 |

* cited by examiner

*Primary Examiner*—Phat X Cao
(74) *Attorney, Agent, or Firm*—Saile Ackerman LLC; Stephen B. Ackerman; Rosemary L. S. Pike (57) ABSTRACT

The invention provides a new method and chip scale package is provided. The inventions starts with a substrate over which a contact point is provided, the contact point is exposed through an opening created in the layer of passivation and a layer of polymer or elastomer. A barrier/seed layer is deposited, a first photoresist mask is created exposing the barrier/seed layer where this layer overlies the contact pad and, contiguous therewith, over a surface area that is adjacent to the contact pad and emanating in one direction from the contact pad. The exposed surface of the barrier/seed layer is electroplated for the creation of interconnect traces. The first photoresist mask is removed from the surface of the barrier/seed layer. A second photoresist mask, defining the solder bump, is created exposing the surface area of the barrier/seed layer that is adjacent to the contact pad and emanating in one direction from the contact pad. The solder bump is created in accordance with the second photoresist mask, the second photoresist mask is removed from the surface of the barrier/seed layer, exposing the electroplating and the barrier/seed layer with the metal plating overlying the barrier/seed layer. The exposed barrier/seed layer is etched in accordance with the pattern formed by the electroplating, reflow of the solder bump is optionally performed.

25 Claims, 5 Drawing Sheets

LOW FABRICATION COST, HIGH PERFORMANCE, HIGH RELIABILITY CHIP SCALE PACKAGE

This application is a continuation of application Ser. No. 10/638,454, filed on Aug. 11, 2003, now U.S. Pat. No. 6,917,119, which is a division of application Ser. No. 09/953,525, filed on Sep. 17, 2001, now U.S. Pat. No. 6,642,136.

BACKGROUND OF THE INVENTION (1) Field of the Invention

The invention relates to the fabrication of integrated circuit devices, and more particularly, to a method and package for semiconductor devices.

(2) Description of the Prior Art

The creation of semiconductor devices, also referred to as Integrated Circuits (IC) has been made possible by the rapid development of supporting technologies such as photolithography and methods of etching. Most of these technologies have over the years had to address concerns created by a continued decrease in device dimensions and increase in device densities. This effort of creating improved performance devices does is not limited in its impact on the device itself but extends into the methods and packages that are used to further interconnect semiconductor devices and to protect these devices from environmental damage. This latter issue has created a packaging technology that is also driven by continuing demands of device miniaturization and denser packaging of devices, this at no penalty to device performance and in a cost-effective manner.

Semiconductor device packaging typically mounts a device on a substrate, such as semiconductor substrates, printed circuit boards, flex circuits, metallized substrates, glass substrates and semiconductor device mounting support. Such a substrate can be a relative complex structure, having multiple payers of interconnect metal distributed throughout the height of the substrate in addition to having interconnect traces created on one or both surfaces of the substrate. In addition, in order to enable the mounting of semiconductor over the surface of the substrate, contact pads such as bond pads are typically provided over at least one of the surfaces of a substrate. For more complex packages, several levels of packaging may be applied whereby a semiconductor device is mounted on a substrate and connected to interconnect metal that is part of the substrate, the first level substrate may be further mounted over the surface of a larger substrate from which the device is interconnected to surrounding circuitry or electrical components. Limitations that are imposed on this method of packaging are typically limitations of electrical performance that is imposed on the device by the packaging interface. For instance, of key concerns are RC delays in the transmission of signals over the various interconnect traces. This places a restraint of size and therefore packaging density on the package. Also of concern are considerations of parasitic capacitance and inductance that are introduced by the package since these parameters have a negative impact on device performance, a more serious impact on high frequency device performance. These parasitic components must therefore be minimized or suppressed to the maximum extent possible.

One or the more conventional methods of connecting a semiconductor device to surrounding points of interconnect is the use of a solder bump. Typically a semiconductor device will be provided on the active surface of the device with points of electrical interconnect which electrically access the device. To connect these points of interconnect to for instance a printer circuit board, solder bumps are provided on the surface of the circuit board that align with the points of electrical contact of the device. The creation of this interface is also subject to requirements imposed by electrical performance of the completed package, by requirements of package miniaturization, reliability, cost performance and the like. The invention provides a package that addresses these packaging concerns in addition to others.

U.S. Pat. No. 6,181,569 (Charkravorty) shows a solder bump process and structure that includes trace formation and bump plating.

U.S. Pat. No. 6,107,180 (Munroe et al.) shows a bump process using UBM and solder bumps.

U.S. Pat. No. 5,879,964 (Paik et al.) shows a related bump and interconnect process.

SUMMARY OF THE INVENTION

A principle objective of the invention is to provide a high-pillar solder bump that sustains a high stand-off of the complete solder bump while maintaining high bump reliability and minimizing damage caused by mismatching of thermal stress factors between the interfacing surfaces.

Another objective of the invention is to provide a method that further improves bump reliability by reducing mechanical and thermal stress.

Yet another objective of the invention is to provide re-distribution bumps which enable the creation of a flip-chip package without requiring a change in the design of the Integrated Circuit and without modifying the pad pitch, the performance of the package is improved and the package size does not need to be modified.

A still further objective of the invention is to provide a chip scale package using one UBM layer of metal, significantly reducing costs of fabrication and materials.

A still further objective of the invention is to provide a chip scale package whereby the solder ball is removed from the semiconductor device, eliminating the need for low-alpha solder, thus reducing fabrication cost and concerns of soft-error occurrence.

In accordance with the objectives of the invention a new method and chip scale package is provided. The inventions starts with a substrate over which a contact point is provided, the contact point and the surface of the substrate are protected by a layer of passivation, the contact point is exposed through an opening created in the layer of passivation. A layer of polymer or elastomer is deposited over the layer of passivation, an opening is created through the layer of polymer or elastomer that aligns with the contact point (contact pad), exposing the contact pad. A barrier/seed layer is deposited over the surface of the layer of polymer or elastomer, including the inside surfaces of the opening created through the layer of polymer or elastomer and the exposed surface of the contact pad. A first photoresist mask is created over the surface of the barrier/seed layer, the first photoresist mask exposes the barrier/seed layer where this layer overlies the contact pad and, contiguous therewith, over a surface area that is adjacent to the contact pad and emanating in one direction from the contact pad. The exposed surface of the barrier/seed layer is electroplated for the creation of interconnect traces. The first photoresist mask is removed from the surface of the barrier/seed layer, a second photoresist mask is created exposing the surface area of the barrier/seed layer that is adjacent to the contact pad and emanating in one direction from the contact pad. The second photoresist mask defines that solder bump. The solder bump is created in accordance with the second photoresist mask, the second photoresist mask is removed from the surface of the barrier/seed layer, exposing the electroplating and the barrier/seed layer with the metal plating overlying the barrier/seed layer. The exposed barrier/seed layer is etched in accordance with the pattern formed by the electroplating, reflow of the solder bump is optionally performed.

BRIEF DESCRIPTION OF THE DRAWINGS

FIGS. 3 through 8 detail the process flow of the invention, as follows:

DESCRIPTION OF THE PREFERRED EMBODIMENTS

Figure 1:
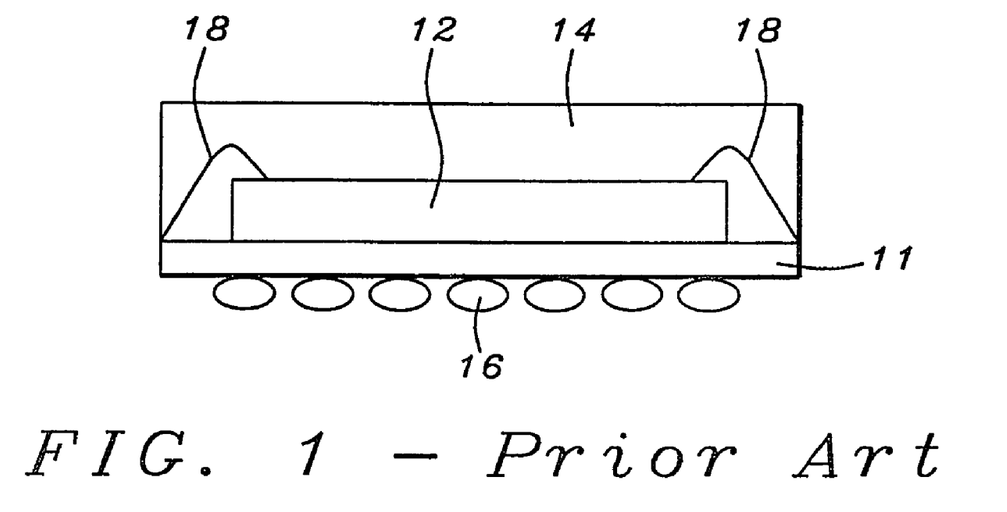
FIG. 1 shows a cross section of a conventional mini-BGA package.
Figure 2:
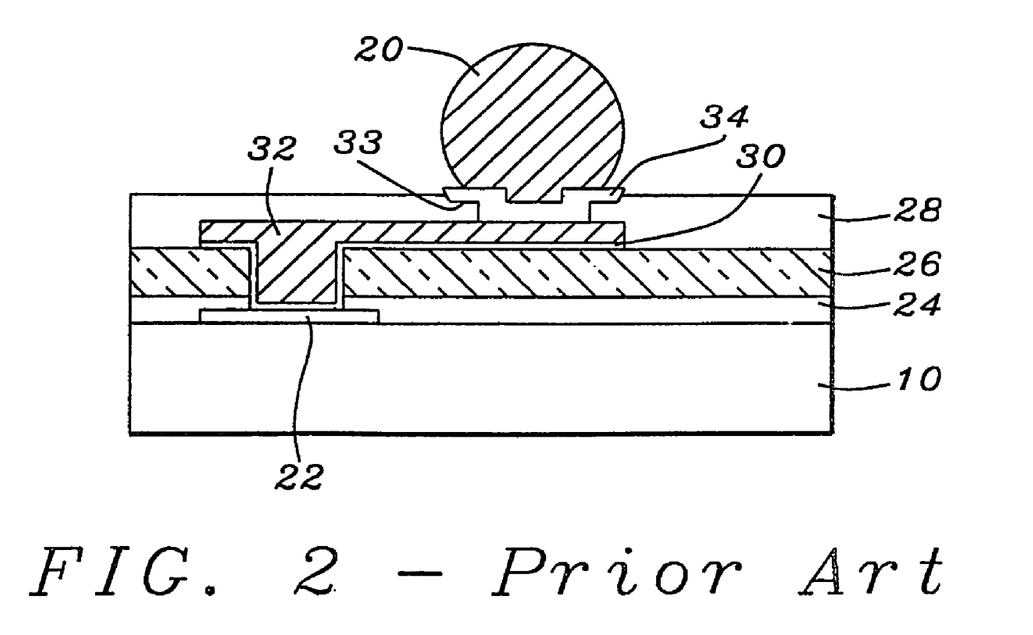
FIG. 2 shows a cross section of a conventional re-routing bump.

Two prior art applications are shown in the cross sections of FIGS. 1 and 2, specifically in the cross section of FIG. 1 are shown:

11, a BGA substrate such as a printed circuit board and the like
12, a semiconductor device or die
14, a molding compound that is used to encapsulate the die 12
16, solder balls that form the electrical interface between the package shown in cross section in FIG. 1 and surrounding circuitry; these solder balls can for instance be further connected to contact pads on the surface of a Printed Circuit Board (PCB)
18, bond wires used to connect points of electrical contact (not shown) on the active surface of die 12 with contact pads (not shown) on the second or upper surface of BGA substrate 11.

FIG. 2 shows a cross section of a conventional re-routing bump, the re-routing applies since the solder bump that is shown in cross section in FIG. 2 does not align with the contact pad with which the solder bump is connected. The elements that are highlighted in the cross section of FIG. 2 are the following:

10, a device supporting silicon substrate
20, a solder ball
22, top metal contact point
24, a layer of passivation, applied for the protection of the underlying surface and the surface of the layer 22 of top metal
26, a layer of dielectric material
28, a layer of passivation, applied for the protection of the underlying layer 26 of dielectric and the surface of the layer 32 of re-routing metal
30, a seed and/or barrier layer
32, a patterned layer of re-routing metal
33, a seed layer, and
34, a layer of UBM metal.

Figure 3:
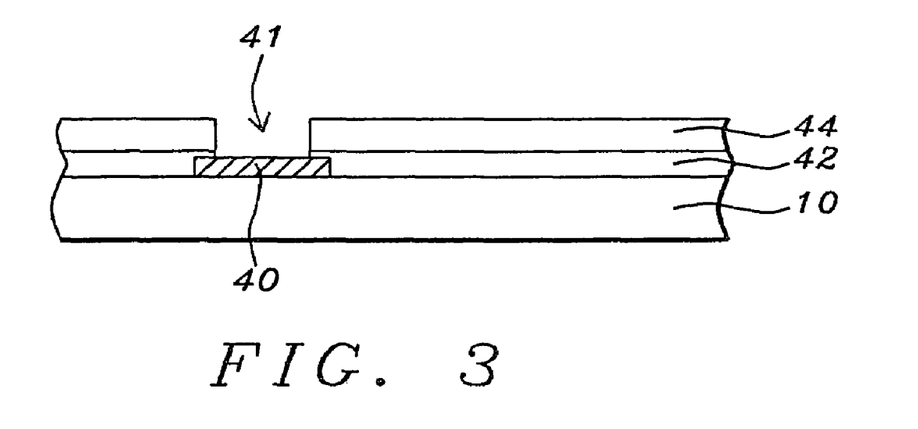
FIG. 3 shows a cross section of a silicon substrate, a top metal contact pad has been provided, a layer of passivation and a layer of polymer or elastomer have been deposited and patterned over the surface of the BGA substrate.

FIGS. 3 through 9 will now be used to describe the invention. Referring specifically to the cross section that is shown in FIG. 3, there is shown:

10, a semiconductor supporting surface such as the surface of a silicon substrate
40, a contact pad or top metal pad that has been provided in or on the surface of the substrate layer 10
42, a layer of passivation deposited over the surface of layer 10; the layer 42 of passivation has been patterned and etched, creating on opening 41 through the layer 42 of passivation that aligns with the contact pad 40
44, a layer of polymer or elastomer that has been deposited over the surface of the layer 42 of passivation; the layer 44 of polymer or elastomer has been patterned and etched, creating on opening 41 through the layer 42 of polymer or elastomer that aligns with the contact pad 40. Contact pad 40 can comprise aluminum or copper or a compound thereof.

As materials that can be used as a polymer for the deposition of layer 44 can be cited polyimide, parylene or teflon, electron resist, solid organics or inorganics, BCB (bisbenzocyclobutene), PMMA (poly-methyl-methacrylate), teflon which is a polymer made from PTFE (polytetrafluoroethylene), also polycarbonate (PC), polysterene (PS), polyoxide (PO) and poly polooxide (PPO).

The semiconductor supporting surface 10 can be semiconductor substrates, printed circuit boards, flex circuits, metallized substrates, glass substrates and semiconductor device mounting support, whereby the semiconductor substrate can selected from the group of substrates consisting of semiconductor substrates, ceramic substrates, glass substrates, gallium arsenide substrates, silicon on insulator (SOI) substrates and silicon on sapphire (SOS) substrates.

Figure 4:
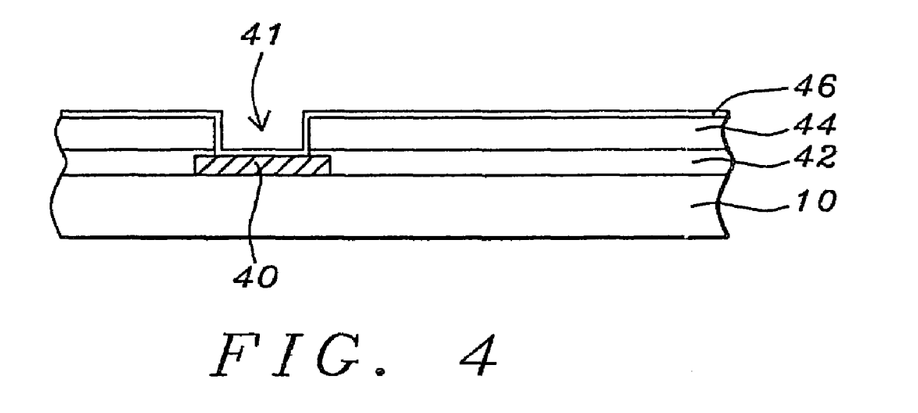
FIG. 4 shows a cross section after a barrier/seed layer has been deposited.

FIG. 4 shows a cross section of the semiconductor substrate after a layer 46 of barrier/seed material has been deposited over the surface of layer 44 of polymer or elastomer; inside surface of opening 41 have also been covered with the layer 46 of barrier/seed material.

A typical barrier layer 46 is deposited using rf. sputtering of titanium nitride, tantalum, tungsten, niobium, molybdenum, Ti/TiN or Ti/W and is more preferably formed from TiN. The barrier layer 46 can also be used to improve the adhesion of a subsequent overlying metal layers. A barrier layer is preferably about 100 and 1000 angstrom thick.

To further enhance the adhesion of a copper interconnect line to the surrounding layer of dielectric or insulation, a seed layer is deposited over the barrier layer. A seed layer can be deposited using a sputter chamber or an Ion Metal Plasma (IMP) chamber at a temperature of between about 0 and 300 degrees C. and a pressure of between about 1 and 100 mTorr, using copper or a copper alloy as-the source at a flow rate of between about 10 and 400 sccm and using argon as an ambient gas. The minimum thickness of a seed layer is about 5,000 Angstrom, this thickness is required achieve a reliable gap fill.

Figure 5:
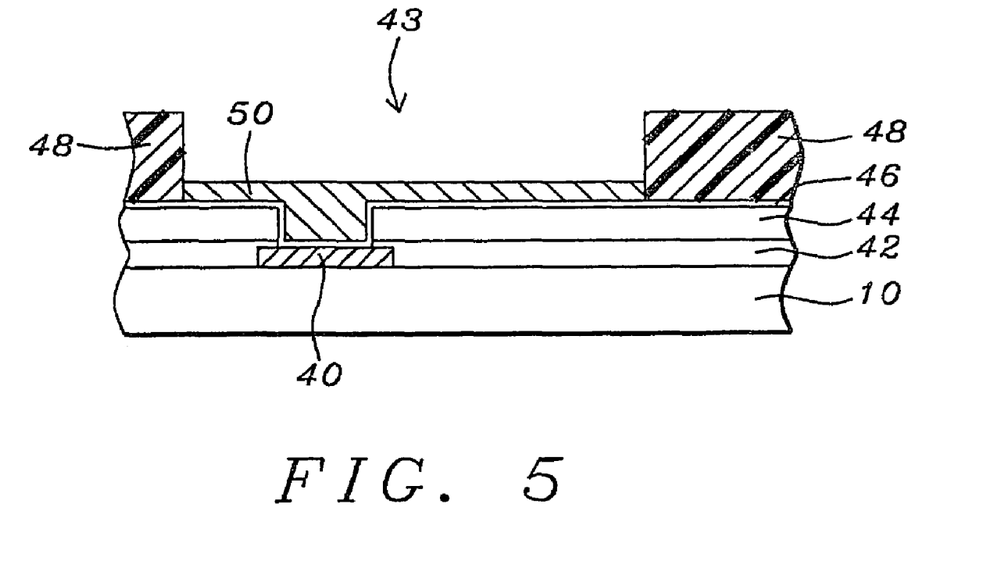
FIG. 5 shows a cross section after a first photoresist mask has been created over the surface of the barrier/seed layer, electroplating has been applied for the deposition of metal for the formation of interconnect traces.

FIG. 5 shows a cross section after:
48, a first photoresist mask has been formed over the surface of barrier/seed layer 46, exposing the surface of the barrier/seed layer 46, and
50, a layer 50 of metal has been over the exposed surface of the barrier/seed layer 46 in accordance with the opening 43 created in the first photoresist mask.

The process of deposition and patterning a layer of photoresist uses conventional methods of photolithography and masking. Layer 48 of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained. The opening 43 that is in this manner created in the layer 48 of photoresist exposes the surface of the layer 44 of barrier/seed material over a surface area where re-routing metal has to be created.

Figure 6:
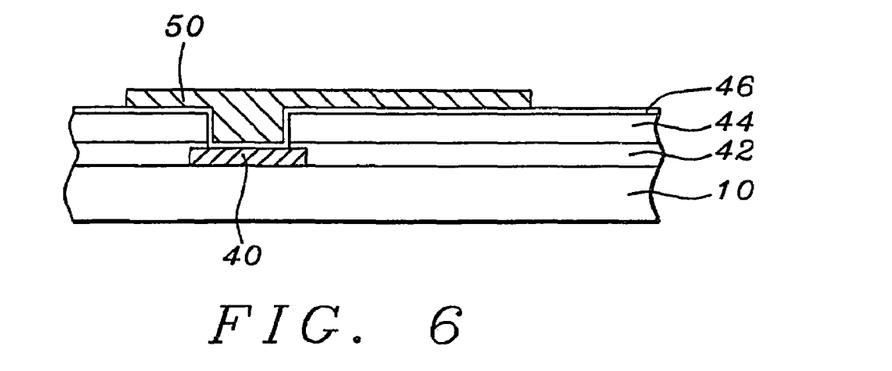
FIG. 6 shows a cross section after the first photoresist mask has been removed from the surface of the barrier/seed layer.

Removal of the first photoresist mask 48 from the surface of the barrier/seed layer 46 results in the cross section that is shown in FIG. 6.

Figure 7:
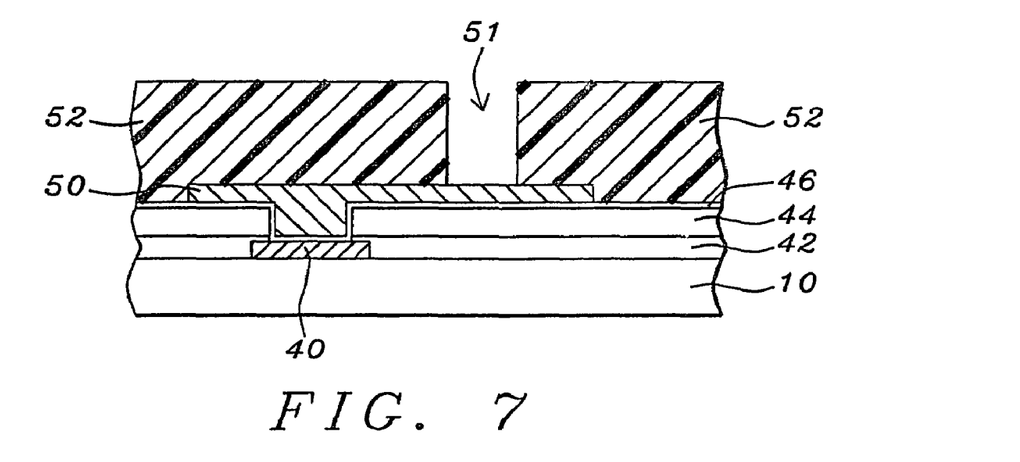
FIG. 7 shows a cross section after a second photoresist mask has been created over the surface of the barrier/seed layer, including the surface of the electroplated interconnect metal; the second photoresist mask defines the solder bump.

The invention continues with the cross section that is shown in FIG. 7, shown are:
52, a second photoresist mask is created over the surface of the barrier/seed layer 46, including the surface of the interconnect metal layer 50, and
51 opening created in the second layer 52 of photoresist, exposing the surface of layer 50 of interconnect metal; opening 51 defined the location and size (diameter) of the to be created solder bump.

Figure 8:
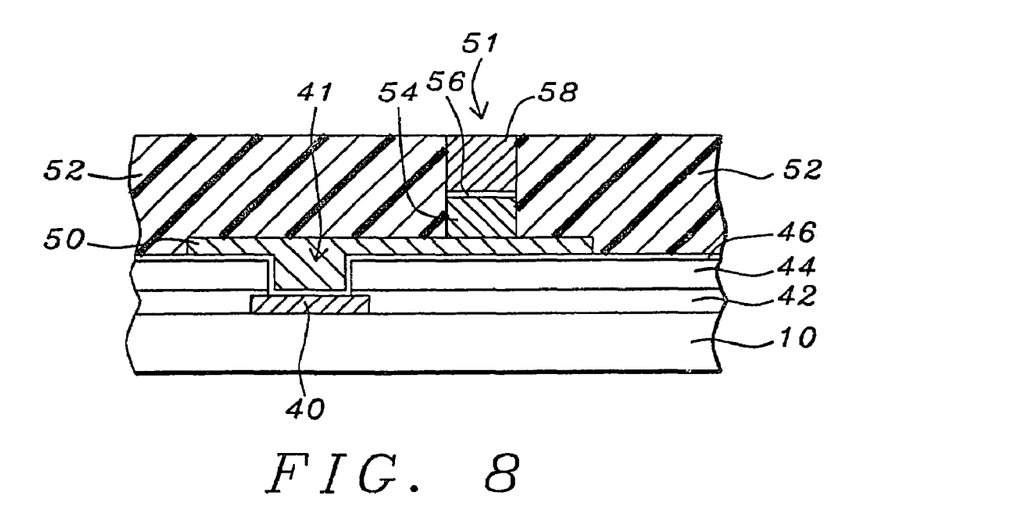
FIG. 8 shows a cross section after the solder bump has been electroplated in accordance with the second photoresist mask.
Figure 9:
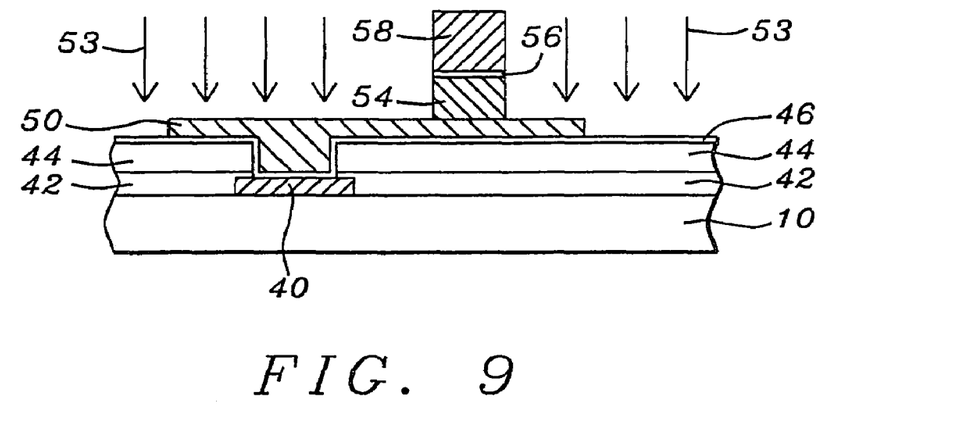
FIG. 9 shows a cross section after removal of the second photoresist mask, exposing the surface of the barrier/seed layer and the electroplated interconnect metal.

The cross section that is shown in FIG. 8 is after the opening 51 created in the second layer of dielectric has been filled with solder bump material. These materials can be selected as:
layer 54 being a first layer of metal, typically comprising copper, deposited to a thickness between about 10 and 100 μm, and more preferably to a thickness of about 50 μm
layer 56 being an UBM layer, typically comprising nickel, deposited to a thickness between about 1 and 10 μm, and more preferably to a thickness of about 5 μm, forming an integral part of the pedestal of the to be created interconnect bump, and
layer 58 is a layer of solder compound, deposited to a thickness between about 10 and 100 μm, and more preferably to a thickness of about 50 μm.

With the completion of the electroplating of these three layers, the solder bump is essentially complete. The second solder mask 52, FIG. 8, is therefore removed from the surface of the barrier/seed layer 46 and the surface of the interconnect metal 50, see FIG. 9, exposing the barrier/seed layer 46 and the interconnect metal 50, a pattern of barrier/seed material overlying the barrier/seed layer 46.

It is good practice and can be of benefit in the creation of the layers 54, 56 and 58 of metal to perform, prior to the electroplating of these layers of metal, an in-situ sputter clean of the exposed surface (exposed through opening 51) of the layer 50 of re-routing metal.

Figure 10:
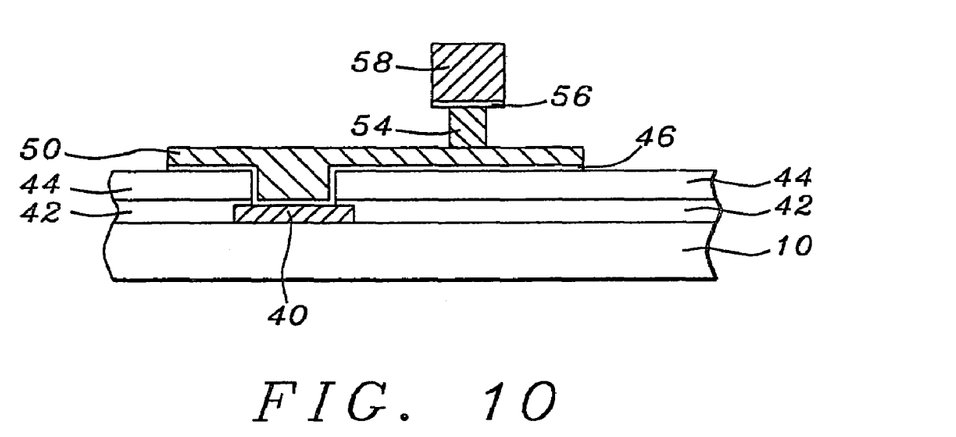
FIG. 10 shows a cross section after the barrier/seed layer has been etched in accordance with the layer of interconnect metal.

The barrier/seed layer 46 can now be etched using the patterned layer 50 of interconnect metal as a mask, which leads to the cross section that is shown in FIG. 10.

It is further good practice to oxidize the surface of the UBM and pillar metal by chemical or thermal oxidation. The chemical oxidation could be an $H_2O_2$ oxidation process, at a temperature in excess of about 150 degrees C. These processing steps can further help prevent wetting of the solder bump to the metal traces.

Reflow can optionally be applied the layer 58 of solder compound, creating a spherical layer 58 of solder which forms the solder bump (not shown). It must be noted in the cross section that is shown in FIG. 10 that the diameter of the UBM layer 54 is, during and as a consequence of the etching of the barrier/seed layer 46, reduced in diameter. This allows the solder ball 58 to be removed from the surface of the substrate by a relatively large distance. From this follows the advantage that it is no longer required that low-alpha solder is used for the solder compound of solder ball 58 reducing manufacturing cost in addition to reducing concerns of memory soft-error conditions.

Layer 56 of UBM may contain multiple layers of metal such as a layer of chrome, followed by a layer of copper, followed by a layer of gold. From the latter it is apparent that layer 56 of UBM may comprise several layers of metal that are successively deposited.

Figure 11:
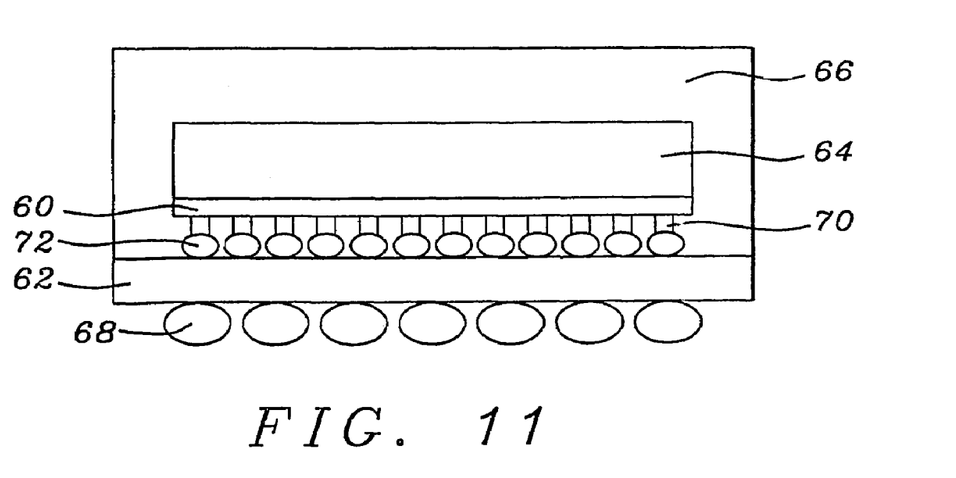
FIG. 11 shows a cross section of the package of the invention with a molding compound as encapsulant.
Figure 12:
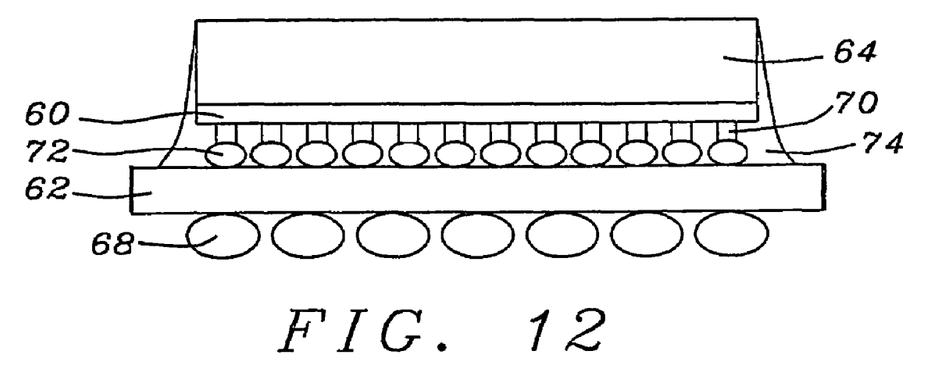
FIG. 12 shows a cross section of the package of the invention with underfill as encapsulant.

Examples of the application of the package of the invention are shown in cross section in FIGS. 11 and 12. Highlighted in FIG. 11 are:
60, a polymer or elastomer layer provided by the invention, similar to layer 44 of FIG. 3 e.a.
62, a BGA substrate over which a semiconductor device is to be mounted
64, a semiconductor device
66, a molding compound applied to encapsulate the device 64
68, contact balls to the package of the invention
70, pillar metal, similar to layers 54 and 56 of FIG. 8 e.a., and
72, a solder bump, similar to layer 58 of FIG. 8 after thermal reflow has been applied to this layer.

Shown in cross section in FIG. 12 is another application of the invention. The elements that have been applied above under FIG. 11 are valid for the cross section shown in FIG. 12 with the exception of element 74, which in the cross section of FIG. 12 is an underfill that has been applied under semiconductor device 64 and that replaces layer 66 of molding compound in FIG. 11 as the means for encapsulating the device 64.

Figure 13:
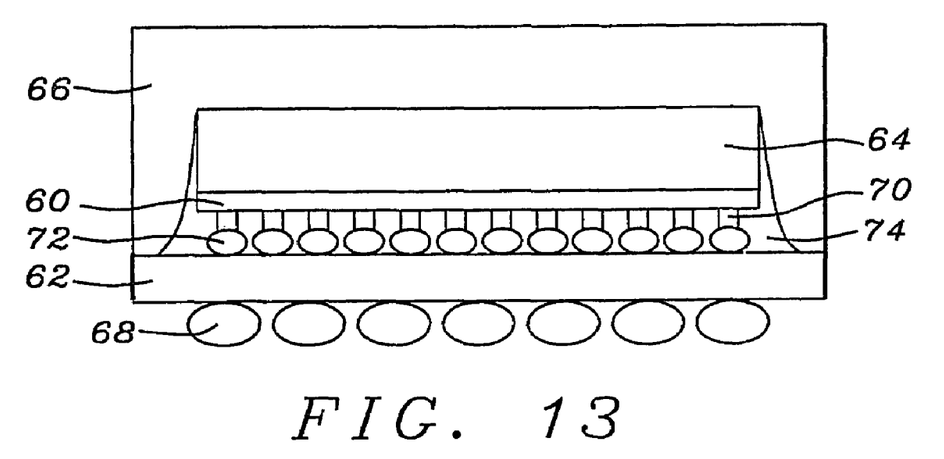
FIG. 13 shows a cross section of the package of the invention using both molding and an underfill.
Figure 14:
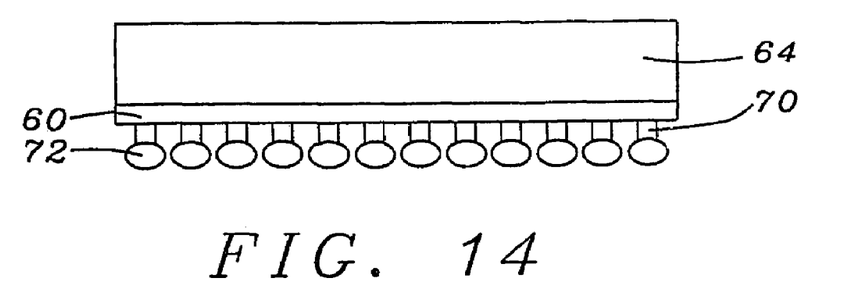
FIG. 14 shows a cross section of the package of the invention as a bare die that can be directly attached to a next level substrate.

FIGS. 13 and 14 show additional applications of the invention with FIG. 13 showing a cross section of the package of the invention using both molding and an underfill while FIG. 14 shows a cross section of the package of the invention as a bare die that can be directly attached to a next level substrate. All elements of the cross sections that are shown in FIGS. 13 and 14 have previously been described and need therefore not be further highlighted at this time.

In order to better highlight the differences between the prior art solder bump, as shown in cross section in FIG. 2, and the solder bump of the invention, as shown in the cross section of FIG. 10, the processing steps to create these two solder bumps are listed below. These steps are easier to follow if it is realized that both methods require and apply two metal fill plating steps, the first of these two step is to create a patterned layer of re-routing metal, the second is to create the solder bump. The processing sequences are as follows:

1. the prior art starts with a device support substrate, a contact pad has been created over the surface of the substrate, layers of passivation and dielectric have been deposited over the surface of the substrate and patterned to expose the contact pad; the invention starts with the same structure
2. the prior art deposits a first seed layer over the surface of the layer of dielectric; the invention does the same
3. the prior art performs a first metal fill over the first seed layer by creating a layer of metal that serves as re-routing metal; the invention does the same
4. the prior art etches the first seed layer; the instant invention does not perform this step at this time
5. the prior art deposits and patterns a layer of passivation, exposing the surface of the layer of re-routing metal, the patterned second layer of passivation serves as a mask for the reflow of the solder bump; the instant invention does not perform this step because the solder bump structure will not wet to the re-routing metal
6. the prior art deposits a second seed layer over the surface of the layer of passivation; the instant invention does not deposit a second seed layer
7. the prior art plates a layer of UBM over which a layer of solder compound is plated; the instant invention deposits a layer of UBM and two metal plating steps, the first metal plating step plating a layer of metal, such as copper or nickel that forms an integral part of the pedestal of the to be created interconnect bump, the second metal plating step depositing a solder compound
8. the prior art performs reflow of the solder compound; the instant invention does the same
9. the prior art etches the second seed layer using the solder ball as a mask; the instant invention etches the first seed layer using the patterned re-routing metal as a mask.

The essential differences between the prior art and the instant invention is provided by the two plating steps and can, for easy reference be summarized as follows:

| Prior Art | Instant Invention |
|---|---|
| First plating step | |
| $1^{st}$ seed layer dep. | $1^{st}$ seed layer dep. |
| plate re-routing metal | plate re-routing metal |
| etch $1^{st}$ seed layer | (no equivalent step) |
| Second plating step | |
| $2^{st}$ seed layer dep. | (no equivalent step) |
| plate UBM + solder | plate UBM + metal + solder |
| etch $2^{st}$ seed layer | etch $1^{st}$ seed layer |

The advantages of the instant invention can be summarized as follows:

1. the height of the metal pillar (layers 54 and 56, FIG. 10) allows for high stand-off between the surface of substrate 10, thereby reducing impact of mismatching of thermal fatigue between interfacing surfaces such as the surface of the substrate 10 and the layers of metal that are part of the solder bump
2. the layer 44 has been highlighted as being a layer of or polymer or elastomer and is selected for its ability to provide stress release between overlying surfaces and thus to enhance solder bump reliability
3. the re-distribution solder bump of the invention allows for creating a flip-chip package without the need for semiconductor device redesign or changes in the pitch of the contact points of the package (the pitch of contact balls 72 and 68, FIGS. 11 and 12); the package size can also remain constant while still being able to package die of different dimensions (due to the flexibility of the routing of the re-routing metal layer 50, FIG. 50, FIG. 10)
4. the method of creating the solder pillar and the solder bump, that is plating a layer of UBM over which metal is plated twice, contributes a significant cost saving in both materials used and in the manufacturing cost; the need for separate UBM plating and etching, for separate plating and etching the pillar metal and for separate plating and etching the solder compound is reduced to using one photoresist mask that is applied for all three steps
5. by creating a relatively high layer of pillar metal, the solder ball is removed from the surface of the substrate; from this follows that low-alpha solder is no longer required as a solder compound for the solder bump, reducing manufacturing costs; from this further follows that soft-error concerns that typically apply to memory chip designs are less valid using the solder bump of the invention
6. by creating a relatively high layer of pillar metal, the solder ball of the instant invention will not wet to the re-routing metal trace. Thus, the second layer of passivation material, which typically serves as a solder mask, is no longer required and, consequently, processing cost is reduced.

In sum: the invention provides a method to create a solder bump having a high metal pillar and a solder ball. Seed/barrier layer deposition is limited to one deposition, a first metal plating step defines the re-routing metal, a second metal plating step creates the solder bump. The need for additional layers of passivation or solder mask has been removed.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A process for fabricating a circuit component, comprising:

providing a silicon substrate, a contact pad over said silicon substrate, and a passivation layer over said silicon substrate, wherein an opening in said passivation layer exposes said contact pad;

depositing a first metal layer over said passivation layer and over said contact pad;

forming a first pattern-defining layer over said first metal layer, wherein an opening in said first pattern-defining layer exposes said first metal layer;

depositing a second metal layer over said first metal layer exposed by said opening in said first pattern-defining layer;

removing said first pattern-defining layer;

forming a second pattern-defining layer over said second metal layer, wherein an opening in said second pattern-defining layer exposes said second metal layer;

depositing a copper layer over said second metal layer exposed by said opening in said second pattern-defining layer;

depositing a nickel layer over said copper layer in said opening in said second pattern-defining layer;

depositing a solder layer over said nickel layer in said opening in said second pattern-defining layer;

removing said second pattern-defining layer; and removing said first metal layer not under said second metal layer and reducing a transverse dimension of said copper layer.

2. The process of claim 1 further comprising forming a polymer layer on said passivation layer, followed by said depositing said first metal layer further on said polymer layer.

3. The process of claim 1, wherein said depositing said first metal layer comprises sputtering.

4. The process of claim 1, wherein said depositing said copper layer comprises electroplating said copper layer with a thickness between 10 and 100 micrometers over said second metal layer exposed by said opening in said second pattern-defining layer.

5. The process of claim 1, after said removing said first metal layer not under said second metal layer, further comprising reflowing said solder layer.

6. The process of claim 1, wherein said depositing said nickel layer comprises electroplating said nickel layer with a thickness between 1 and 10 micrometers over said copper layer in said opening in said second pattern-defining layer.

7. The process of claim 1, wherein said depositing said solder layer comprises electroplating.

8. The process of claim 1, wherein said depositing said solder layer comprises electroplating said solder layer with a thickness between 10 and 100 micrometers over said nickel layer in said opening in said second pattern-defining layer.

9. The process of claim 1, wherein said depositing said second metal layer comprises electroplating.

10. The process of claim 1, wherein said depositing said first metal layer comprises sputtering a titanium-containing layer over said passivation layer and over said contact pad.

11. A process for fabricating a circuit component, comprising:

providing a silicon substrate, a first pad over said silicon substrate, and a passivation layer over said silicon substrate, wherein an opening in said passivation layer exposes said first pad;

providing a metal trace over said passivation layer and over said first pad, wherein said metal trace comprises a second pad connected to said first pad through said opening in said passivation layer, and wherein the position of said second pad from a top view is different from that of said first pad;

forming a pattern-defining layer on said metal trace, wherein an opening in said pattern-defining layer exposes said second pad;

depositing a copper layer over said second pad exposed by said opening in said pattern-defining layer;

depositing a nickel layer over said copper layer in said opening in said pattern-defining layer;

depositing a solder layer over said nickel layer in said opening in said pattern-defining layer;

removing said pattern-defining layer; and reducing a transverse dimension of said copper layer.

12. The process of claim 11 further comprising providing a polymer layer between said metal trace and said passivation layer.

13. The process of claim 11, after said removing said pattern-defining layer, further comprising reflowing said solder layer.

14. The process of claim 11, wherein said depositing said copper layer comprises electroplating said copper layer with a thickness between 10 and 100 micrometers over said second pad exposed by said opening in said pattern-defining layer.

15. The process of claim 11, wherein said depositing said nickel layer comprises electroplating a nickel layer with a thickness between 1 and 10 micrometers over said copper layer in said opening in said pattern-defining layer.

16. The process of claim 11, wherein said metal trace is formed by a process comprising electroplating.

17. The process of claim 11, wherein said depositing said solder layer comprises electroplating.

18. The process of claim 11, wherein said depositing said solder layer comprises electroplating said solder layer with a thickness between 10 and 100 micrometers over said nickel layer in said opening in said pattern-defining layer.

19. The process of claim 12, wherein said polymer layer comprises polyimide.

20. The process of claim 11, wherein said first pad comprises copper.

21. A process for fabricating a circuit component, comprising:

providing a silicon substrate, a copper pad over said silicon substrate, and a passivation layer over said silicon substrate, wherein an opening in said passivation layer exposes said copper pad;

depositing a first metal layer over said passivation layer and over said copper pad;

forming a first pattern-defining layer over said first metal layer, wherein an opening in said first pattern-defining layer exposes said first metal layer;

depositing a second metal layer over said first metal layer exposed by said opening in said first pattern-defining layer;

removing said first pattern-defining layer;

forming a second pattern-defining layer over said second metal layer, wherein an opening in said second pattern-defining layer exposes said second metal layer;

depositing a copper layer with a thickness between 10 and 100 micrometers over said second metal layer exposed by said opening in said second pattern-defining layer;

depositing a nickel layer over said copper layer in said opening in said second pattern-defining layer;

depositing a solder layer over said nickel layer in said opening in said second pattern-defining layer;

removing said second pattern-defining layer; and removing said first metal layer not under said second metal layer and reducing a transverse dimension of said copper layer.

22. The process of claim 21, wherein said depositing said second metal layer comprises electroplating.

23. The process of claim 21, wherein said depositing said nickel layer comprises electroplating said nickel layer with a thickness between 1 and 10 micrometers over said copper layer in said opening in said second pattern-defining layer.

24. The process of claim 21, wherein said depositing said solder layer comprises electroplating said solder layer with a thickness between 10 and 100 micrometers over said nickel layer in said opening in said second pattern-defining layer.

25. The process of claim 21 further comprising providing a polymer layer on said passivation layer, followed by said depositing said first metal layer further on said polymer layer.

* * * * *